(12) United States Patent
Wu et al.

(10) Patent No.: US 11,812,646 B2
(45) Date of Patent: *Nov. 7, 2023

(54) DISPLAY DEVICE AND MANUFACTURING METHOD THEREOF

(71) Applicant: Taiwan Semiconductor Manufacturing Company, Ltd., Hsinchu (TW)

(72) Inventors: Sheng-Yu Wu, Hsinchu (TW); Mirng-Ji Lii, Hsinchu County (TW); Shang-Yun Tu, Hsinchu (TW); Ching-Hui Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/580,659

(22) Filed: Jan. 21, 2022

(65) Prior Publication Data

US 2022/0149141 A1 May 12, 2022

Related U.S. Application Data

(63) Continuation of application No. 16/866,519, filed on May 4, 2020, now Pat. No. 11,239,305.

(60) Provisional application No. 62/877,846, filed on Jul. 24, 2019.

(51) Int. Cl.
| | |
|---|---|
| *H01L 21/00* | (2006.01) |
| *H10K 59/131* | (2023.01) |
| *H10K 59/121* | (2023.01) |
| *H10K 71/00* | (2023.01) |

(52) U.S. Cl.
CPC ......... *H10K 59/131* (2023.02); *H10K 59/121* (2023.02); *H10K 71/00* (2023.02)

(58) Field of Classification Search
CPC .................................................. H10K 59/131
See application file for complete search history.

(56) References Cited

U.S. PATENT DOCUMENTS

| | | | | |
|---|---|---|---|---|
| 9,634,287 | B1* | 4/2017 | Shin | H10K 59/124 |
| 11,239,305 | B2* | 2/2022 | Wu | H10K 59/131 |
| 2009/0101904 | A1* | 4/2009 | Yamamoto | H10K 59/124 |
| | | | | 257/59 |
| 2014/0197396 | A1* | 7/2014 | Madigan | H10K 71/135 |
| | | | | 438/34 |

(Continued)

*Primary Examiner* — Douglas M Menz
(74) *Attorney, Agent, or Firm* — JCIPRNET

(57) ABSTRACT

A display device includes a semiconductor substrate, an isolation layer, a light-emitting layer and a second electrode. The semiconductor substrate has a pixel region and a peripheral region located around the pixel region. The semiconductor substrate includes first electrodes and a driving element layer. The first electrodes are disposed in the pixel region and the first electrodes are electrically connected to the driving element layer. The isolation layer is disposed on the semiconductor substrate. The isolation layer includes a first isolation pattern disposed in the peripheral region, and the first isolation pattern has a first side surface and a second side surface opposite to the first side surface. The light-emitting layer is disposed on the isolation layer and the first electrodes, and covers the first side surface and the second side surface of the first isolation pattern. The second electrode is disposed on the light-emitting layer.

20 Claims, 10 Drawing Sheets

(56) References Cited

U.S. PATENT DOCUMENTS

2016/0307971 A1* 10/2016 Jeon .................... G09G 3/3233
2017/0294501 A1* 10/2017 Jang .................... H04R 1/2811
2020/0136087 A1*  4/2020 Kim ..................... H10K 71/00
2021/0249631 A1*  8/2021 Kokame .............. H10K 59/122

* cited by examiner

DISPLAY DEVICE AND MANUFACTURING METHOD THEREOF

CROSS-REFERENCE TO RELATED APPLICATION

This application is a continuation application of and claims the priority benefit of U.S. patent application Ser. No. 16/866,519, filed on May 4, 2020 and now allowed, which claims the priority benefit of U.S. provisional application Ser. No. 62/877,846, filed on Jul. 24, 2019. The entirety of each of the above-mentioned patent applications is hereby incorporated by reference herein and made a part of this specification.

BACKGROUND

With rapidly advancing semiconductor technologies in the recent years, near-eye displays have gained popularity. Due to limitations in current fabrication technology, it is difficult to reduce the spacing between the light-emitting elements of the display device. The development of fabrication technologies for display devices used in near-eye displays at wafer level is underway to satisfy demands for size reduction and high resolution.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
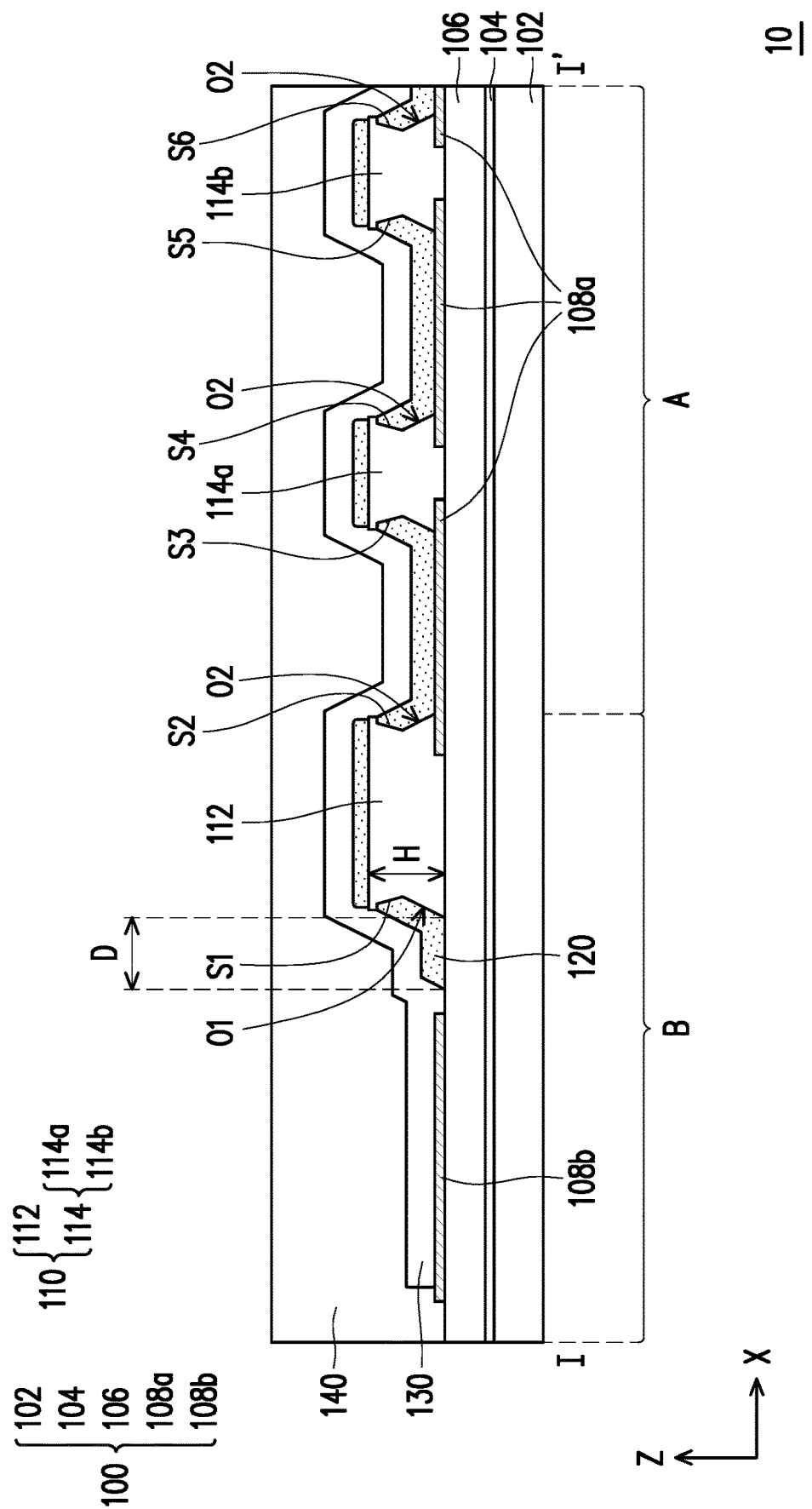
FIG. 1 is a schematic cross-sectional view of a display device in accordance with some embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third", "fourth" and the like, may be used herein for ease of description to describe similar or different element(s) or feature(s) as illustrated in the figures, and may be used interchangeably depending on the order of the presence or the contexts of the description.

Figure 2:
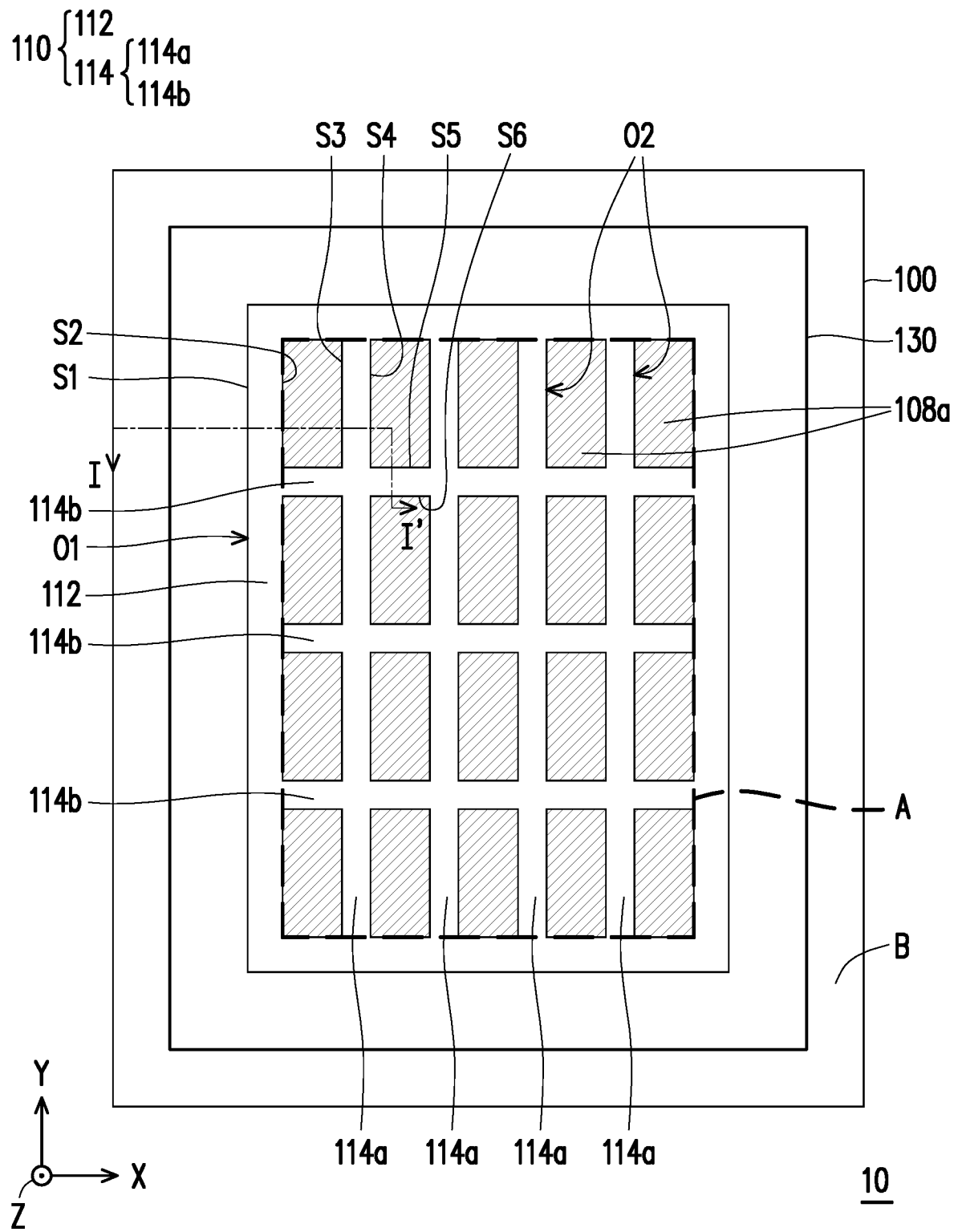
FIG. 2 is a simplified top view of a display device in accordance with some embodiments of the present disclosure.

FIG. 1 is a schematic cross-sectional view of a display device 10 in accordance with some embodiments of the present disclosure. FIG. 2 is a simplified top view of the display device 10 in accordance with some embodiments of the present disclosure. Specifically, FIG. 1 is a cross-sectional view taken along the line I-I' of FIG. 2. For simplicity and clarity of illustration, only few elements of the display device 10, such as a semiconductor substrate, an isolation layer, first electrodes and a second electrode, are shown in the simplified top view of FIG. 2, and these elements are not necessarily in the same plane.

Referring to FIG. 1 and FIG. 2, the display device 10 includes a semiconductor substrate 100, an isolation layer 110, a light-emitting layer 120, and a second electrode 130. In some embodiments, the display device 10 may further include a dielectric encapsulation 140. In some embodiments, the display device 10 is a self-luminescent display device. In certain embodiments, the display device 10 is an organic light-emitting diode (OLED) display device. In some alternative embodiments, the display device 10 further includes other required elements, such as a cover plate, glass and/or transparent shielding. That is to say, the display device 10 of the disclosure is not limited to what is depicted in FIG. 1. In some embodiments, the cover plate and the semiconductor substrate 100 are disposed opposite each other. In some embodiments, the cover plate may be a flexible substrate, such as a polymer substrate or a plastic substrate. However, the disclosure is not limited thereto. In some alternative embodiments, the cover plate is a rigid substrate, such as a glass substrate, a quartz substrate, or a silicon substrate.

In some embodiments, the semiconductor substrate 100 has a pixel region A and a peripheral region B located around the pixel region A. As shown in FIG. 2, from the top view, the peripheral region B has a ring shape. In some embodiments, the semiconductor substrate 100 includes a substrate 102, a driving element layer 104, an interconnect structure 106, first electrodes 108a and a common electrode 108b. In some embodiments, the substrate 102 is made of an elemental semiconductor material such as crystalline silicon, diamond, or germanium; a compound semiconductor material such as silicon carbide, gallium arsenic, indium arsenide, or indium phosphide; or an alloy semiconductor material such as silicon germanium, silicon germanium carbide, gallium arsenic phosphide, or gallium indium phosphide. In some embodiments, the substrate 102 is a bulk semiconductor material. For example, the substrate 102 may be a bulk silicon substrate, such as a bulk substrate of monocrystalline silicon, a doped silicon substrate, an undoped silicon substrate, or an SOI substrate, where the dopant of the doped silicon substrate may be an N-type dopant, a P-type dopant or a combination thereof.

In some embodiments, the driving element layer 104 is disposed on the substrate 102. In some embodiments, the driving element layer 104 includes active components (e.g., transistors or the like) and/or passive components (e.g., resistors, capacitors, inductors, or the like) formed therein. In some embodiments, the driving element layer 104 is a complementary metal-oxide-semiconductor (CMOS) circuit layer.

In some embodiments, the interconnect structure 106 is used for connecting to the active components (not shown) and/or the passive components (not shown) in the driving element layer 104. In some embodiments, the interconnect structure 106 includes an insulating layer (not shown) and a plurality of metal features (not shown) disposed in the insulating layer. In some embodiments, the insulating layer includes an inter-layer dielectric (ILD) layer on the driving element layer 104, and at least one inter-metal dielectric (IMD) layer over the inter-layer dielectric layer. In some embodiments, the material of the insulating layer includes silicon oxide, silicon oxynitride, silicon nitride, a low dielectric constant (low-k) material or a combination thereof. The insulating layer may be a single layer or a multiple-layer structure. In some embodiments, the metal features include metal lines and vias (not shown). In some embodiments, the material of the metal features includes tungsten (W), copper (Cu), a copper alloy, aluminum (Al), an aluminum alloy or a combination thereof. In some embodiments, the interconnect structure 106 is formed by a dual damascene process. In alternative embodiments, the interconnect structure 106 is formed by multiple single damascene processes. In yet alternative embodiments, the interconnect structure 106 is formed by an electroplating process.

In some embodiments, the first electrodes 108a are disposed in the pixel region A. In some embodiments, some of the first electrodes 108a are disposed in the pixel region A and further extend into the peripheral region B, as shown in FIG. 1. However, the disclosure is not limited thereto. In some alternative embodiments, none of the first electrodes 108a is disposed in the peripheral region B. In some embodiments, the first electrodes 108a are electrically connected to the active components (not shown) and/or the passive components (not shown) in the driving element layer 104 through the interconnect structure 106. That is to say, the driving signals can be transmitted to the first electrodes 108a through the active components (not shown) in the driving element layer 104 and the interconnect structure 106. In some embodiments, the material of the first electrodes 108a includes a transparent conductive material. In certain embodiments, the transparent conductive material may include a metal oxide conductive material, such as indium tin oxide, indium zinc oxide, aluminum tin oxide, aluminum zinc oxide, indium gallium zinc oxide, other suitable oxides, or a stacked layer of at least two of the aforesaid materials. However, the disclosure is not limited thereto. In some alternative embodiments, the material of the first electrodes 108a includes a non-transparent conductive material. In certain embodiments, the non-transparent conductive material includes metal. In some embodiments, the first electrodes 108a are disposed over the illustrated top surface of the interconnect structure 106, as shown in FIG. 1. However, the disclosure is not limited thereto. In some alternative embodiments, the first electrodes 108a are embedded in the interconnect structure 106. In some embodiments, the first electrodes 108a are formed by photolithography and etching processes. For instance, a method for forming the first electrodes 108a may include forming a conductive material layer entirely on the interconnect structure 106 by suitable fabrication techniques such as chemical vapor deposition (CVD), physical vapor deposition (PVD), or evaporation; and then performing the photolithography and etching processes to pattern the conductive material layer. In the display device 10, the number of the first electrodes 108a may be less than or more than what is depicted in FIG. 2, and may be designated based on the demand and/or design layout; the disclosure is not specifically limited thereto.

In some embodiments, the common electrode 108b is disposed in the peripheral region B. In some embodiments, the common electrode 108b is electrically connected to a ground (e.g., 0V). In some embodiments, the material of the common electrode 108b includes a transparent conductive material. In certain embodiments, the transparent conductive material includes a metal oxide conductive material, such as indium tin oxide, indium zinc oxide, aluminum tin oxide, aluminum zinc oxide, indium gallium zinc oxide, other suitable oxides, or a stacked layer of at least two of the aforesaid materials. However, the disclosure is not limited thereto. In some alternative embodiments, the material of the common electrode 108b includes a non-transparent conductive material. In certain embodiments, the non-transparent conductive material includes metal. In certain embodiments, the material of the common electrode 108b is the same as that of the first electrodes 108a. In certain embodiments, the material of the common electrode 108b is different from that of the first electrodes 108a. In some embodiments, the common electrode 108b is disposed over the illustrated top surface of the interconnect structure 106, as shown in FIG. 1. However, the disclosure is not limited thereto. In some alternative embodiments, the common electrode 108b is embedded in the interconnect structure 106. In some embodiments, the common electrode 108b is formed by photolithography and etching processes. A method for forming the common electrode 108b may include: forming a conductive material layer entirely on the interconnect structure 106 by suitable fabrication techniques such as chemical vapor deposition (CVD), physical vapor deposition (PVD), or evaporation; then performing the photolithography and etching processes to pattern the conductive material layer. In some embodiments, the common electrode 108b and the first electrodes 108a are formed in the same process. That is to say, the common electrode 108b and the first electrodes 108a all are originated from the same conductive material layer. However, the disclosure is not limited thereto. In some alternative embodiments, the common electrode 108b and the first electrodes 108a are formed in separate processes. As shown in FIG. 2, one common electrode 108b is provided in the peripheral region B, but the disclosure is not limited thereto. The number of the common electrodes 108b may be more than what is depicted in FIG. 2, and may be designated based on demand and/or design layout.

In some embodiments, the isolation layer 110 is disposed on the semiconductor substrate 100. In some embodiments, the material of the isolation layer 110 includes silicon oxide, silicon oxynitride, silicon nitride, or a combination thereof. In certain embodiments, the isolation layer 110 is an oxidenitride-oxide (ONO) layer. In some embodiments, the isolation layer 110 is formed by photolithography and etching processes.

In some embodiments, the isolation layer 110 includes a first isolation pattern 112 and a second isolation pattern 114, and the first isolation pattern 112 is located around the second isolation pattern 114. In some embodiments, the first isolation pattern 112 is disposed in the peripheral region B. As shown in FIG. 2, from the top view, the first isolation pattern 112 has a ring shape. In some embodiments, the first isolation pattern 112 has a first side surface S1 and a second side surface S2 opposite to the first side surface S1. The second side surface S2 of the first isolation pattern 112 faces toward the second isolation pattern 114, as shown in FIG. 2. The second side surface S2 is closer to the pixel region A than the first side surface S1, as shown in FIG. 1. In some embodiments, as shown in FIG. 1, the cross-sectional profile of the first side surface S1 and the cross-sectional profile of the second side surface S2 are substantially symmetric with each other. The cross-sectional profile of the first side surface S1 and the cross-sectional profile of the second side surface S2 may be the mirror image of each other. With such configuration, the cross-sectional profile of the first side surface S1 and the cross-sectional profile of the second side surface S2 may be regarded as substantially the same.

In some embodiments, the second isolation pattern 114 is disposed in the pixel region A. In some embodiments, the second isolation pattern 114 has first pattern portions 114a and second pattern portions 114b. In some embodiments, as shown in FIG. 2, the first pattern portions 114a are arranged along the direction X perpendicular to the thickness direction Z of the semiconductor substrate 100, and the second pattern portions 114b are arranged along the direction Y perpendicular to the thickness direction Z, wherein the direction X is perpendicular to the direction Y. In some embodiments, each first pattern portion 114a extends along the direction Y, and each second pattern portion 114b extends along the direction X, as shown in FIG. 2. As shown in FIG. 2, the first pattern portions 114a are connected to the second pattern portions 114b to constitute a mesh structure.

In some embodiments, each first pattern portion 114a has a third side surface S3 and a fourth side surface S4 opposite to the third side surface S3, and each second pattern portion 114b has a fifth side surface S5 and a sixth side surface S6 opposite to the fifth side surface S5. In some embodiments, as shown in FIG. 1, the cross-sectional profile of the third side surface S3 and the cross-sectional profile of the fourth side surface S4 are substantially symmetric with each other. The cross-sectional profile of the third side surface S3 and the cross-sectional profile of the fourth side surface S4 may be mirror images of each other. With such configuration, the cross-sectional profile of the third side surface S3 and the cross-sectional profile of the fourth side surface S4 may be regarded as substantially the same. Similarly, as shown in FIG. 1, the cross-sectional profile of the fifth side surface S5 and the cross-sectional profile of the sixth side surface S6 are substantially symmetric with each other, thereby the cross-sectional profile of the fifth side surface S5 and the cross-sectional profile of the sixth side surface S6 may be regarded as substantially the same. Further, in some embodiments, as shown in FIG. 1, the cross-sectional profile of the third side surface S3 is substantially the same as the cross-sectional profile of the fifth side surface S5. That is to say, in the second isolation pattern 114, the first pattern portions 114a and the second pattern portions 114b have substantially the consistent cross-sectional profile of the side surfaces. In some embodiments, as shown in FIG. 1, the cross-sectional profile of the first side surface S1 is substantially the same as the cross-sectional profile of the third side surface S3. That is to say, in the isolation layer 110, the first isolation pattern 112 and the second isolation pattern 114 have substantially consistent cross-sectional profile of the side surfaces. In certain embodiments, the profile dimension difference between the cross-sectional profile of the side surfaces of the first isolation pattern 112 and the cross-sectional profile of the side surfaces of the second isolation pattern 114 is less than about 10%.

In some embodiments, the isolation layer 110 has a first opening O1 in the peripheral region B and second openings O2 in the pixel region A. In some embodiments, some of the second openings O2 are disposed in the pixel region A and further extend into the peripheral region B, as shown in FIG. 1. However, the disclosure is not limited thereto. In some alternative embodiments, none of the second openings O2 is disposed in the peripheral region B.

Specifically, referring to FIG. 1 and FIG. 2 together, the first opening O1 is an unenclosed opening having a single sidewall which is defined by the isolation layer 110. The first side surface S1 of the first isolation pattern 112 may be considered as the sidewall of the first opening O1. In some embodiments, as shown in FIG. 1, along the thickness direction Z of the semiconductor substrate 100, the vertical projection of the common electrode 108b onto the substrate 102 falls within the span of the vertical projection of the first opening O1 onto the substrate 102. That is to say, during the process for manufacturing the display device 10, in some stages, the common electrode 108b may be exposed by the first opening O1.

In addition, referring to FIG. 1 and FIG. 2 together, each second opening O2 is an enclosed opening of which the vertical projection onto the substrate 102 along the thickness direction Z is in a rectangle shape. In other words, each second opening O2 has four sidewalls. However, the disclosure is not limited thereto. In some alternative embodiments, the vertical projection of each second opening O2 onto the substrate 102 along the thickness direction Z may exhibit a polygonal shape or any suitable shape from the top view. In some embodiments, the sidewalls of each second opening O2 are defined by the isolation layer 110. In detail, as shown in FIG. 2, the sidewalls of each of the second openings O2 at the edge of the pixel region A are defined by both of the first isolation pattern 112 and the second isolation pattern 114, and the sidewalls of each of the second openings O2 at the central of the pixel region A are defined only by the second isolation pattern 114. That is to say, the second side surface S2 of the first isolation pattern 112, the third side surfaces S3 and the fourth side surfaces S4 of the first pattern portions 114a, and the fifth side surfaces S5 and the sixth side surfaces S6 of the second pattern portions 114b may be considered as the sidewalls of the second openings O2. Referring to FIG. 1 and FIG. 2 together, the second side surface S2 of the first isolation pattern 112, the third side surface S3 of the first pattern portion 114a and the fifth side surface S5 of the second pattern portion 114b may be considered as the sidewalls of the illustrated left second opening O2 shown in the FIG. 1, the second side surface S2 of the first isolation pattern 112, the third side surface S3 of the first pattern portion 114a, the fourth side surface S4 of the another first pattern portion 114a and the fifth side surface S5 of the second pattern portion 114b may be considered as the sidewalls of the illustrated central second opening O2 shown in the FIG. 1, and the third side surface S3 of the first pattern portion 114a, the fourth side surface S4 of the another first pattern portion 114a, the fifth side surface S5 of the second pattern portion 114b and the sixth side surface S6 of the another second pattern portion 114b may be considered as the sidewalls of the illustrated right second opening O2 shown in the FIG. 1.

In some embodiments, as shown in FIG. 1 and FIG. 2, the second openings O2 are disposed corresponding to the underlying first electrodes 108a. In detail, as shown in FIG. 1 and FIG. 2, along the thickness direction Z of the semiconductor substrate 100, the vertical projection of the first electrode 108a onto the substrate 102 is partially overlapped with the span of the vertical projection of the corresponding second opening O2 onto the substrate 102. That is to say, during the process for manufacturing the display device 10, in the stage of forming the second openings O2, the first electrodes 108a are partially exposed by the second openings O2. As mentioned above, the number of the first electrodes 108a is not limited to what is depicted in FIG. 2, thereby the number of the second openings O2 corresponding to the first electrodes 108a also is not limited to what is depicted in FIG. 2, and may be designated based on the demand and/or design layout.

In some embodiments, the light-emitting layer 120 is disposed on the isolation layer 110 and the first electrodes 108a. In some embodiments, the light-emitting layer 120 may be any light-emitting layer that can be used in the display device and is well-known to people having ordinary skill in the art. In some embodiments, the material of the light-emitting layer 120 may include organic light-emitting materials in red, green, blue, white, other suitable colors, or a combination of said light-emitting materials. For instance, in certain embodiments, the light-emitting layer 120 includes a white organic light-emitting material. In some embodiments, the light-emitting layer 120 further includes other organic functional layers, such as an electron transport layer, an electron injection layer, a hole transport layer, a hole injection layer, or a combination of said functional layers.

In some embodiments, the light-emitting layer 120 is discontinuously disposed on the isolation layer 110 and the first electrodes 108a, as shown in FIG. 1. Specifically, during the process for forming the light-emitting layer 120, the light-emitting layer 120 is cut by the isolation layer 110 due to the cross-sectional profile of the side surfaces. That is to say, the isolation layer 110 is configured to render the light-emitting layer 120 being discontinuously disposed. The configuration of the cross-sectional profile of the side surfaces of the isolation layer 110 may not be limited to what is depicted in FIG. 1, and may be designated based on the demand and/or design layout as long as the isolation layer 110 may render the light-emitting layer 120 being discontinuously disposed.

In some embodiments, portions of the light-emitting layer 120 are disposed in the second openings O2. In detail, as shown in FIG. 1, the portions of the light-emitting layer 120 disposed in the second openings O2 are directly in contact with the underlying first electrodes 108a which are exposed by the second openings O2. Further, as shown in FIG. 1, the portions of the light-emitting layer 120 disposed in the second openings O2 cover the sidewalls of the second openings O2 being defined by the isolation layer 110. That is to say, the second side surface S2 of the first isolation pattern 112, the third side surfaces S3 and the fourth side surfaces S4 of the first pattern portions 114a, and the fifth side surfaces S5 and the sixth side surfaces S6 of the second pattern portions 114b are covered by the light-emitting layer 120.

In some embodiments, a portion of the light-emitting layer 120 is disposed in the first opening O1. In detail, as shown in FIG. 1, the portion of the light-emitting layer 120 disposed in the first opening O1 covers the sidewall of the first opening O1 being defined by the isolation layer 110 (i.e., the first side surface S1 of the first isolation pattern 112) and a portion of the illustrated top surface of the semiconductor substrate 100 exposed by the first opening O1. That is to say, the portion of the light-emitting layer 120 disposed in the first opening O1 extends from the first side surface S1 of the first isolation pattern 112 to the illustrated top surface of the semiconductor substrate 100 uncovered by the first isolation pattern 112 in the peripheral region B. Further, as shown in FIG. 1, the minimum distance D between the outer edge of the portion of the light-emitting layer 120 disposed in the first opening O1 and the first side surface S1 of the first isolation pattern 112 (i.e., the sidewall of the first opening O1) is equal to or larger than half of the height H of the isolation layer 110. That is to say, the outer edge of the portion of the light-emitting layer 120 disposed in the first opening O1 protrudes by the minimum distance D to the first side surface S1 of the first isolation pattern 112. In other words, the semiconductor substrate 100 is covered by the portion of the light-emitting layer 120 disposed in the first opening O1 by the range of the minimum distance D. As shown in FIG. 1, along the direction X perpendicular to the thickness direction Z of the semiconductor substrate 100, in a vertical projection on the illustrated top surface of the semiconductor substrate 100, a projection location of the outermost edge of the whole light-emitting layer 120 is beside a projection location of the outermost edge of the whole isolation layer 110 for the minimum distance D.

In some embodiments, the second electrode 130 is disposed on the light-emitting layer 120. In some embodiments, the second electrode 130 extends from the pixel region A toward the peripheral region B, as shown in FIG. 2. Further, in some embodiments, the second electrode 130 is disposed in the first opening O1 and the second openings O2, as shown in FIG. 1. In some embodiments, the second electrode 130 is directly in contact with the underlying common electrode 108b to connect electrically with the semiconductor substrate 100. As mentioned above, the common electrode 108b may be electrically grounded, such that the second electrode 130 may also be electrically grounded. In some embodiments, the material of the second electrode 130 includes a transparent conductive material. In certain embodiments, the transparent conductive material includes or is a metal oxide conductive material, such as indium tin oxide, indium zinc oxide, aluminum tin oxide, aluminum zinc oxide, indium gallium zinc oxide, other suitable oxides, or a stacked layer of at least two of the aforesaid materials. However, the disclosure is not limited thereto. In some alternative embodiments, the material of the second electrode 130 includes a non-transparent conductive material. In certain embodiments, the non-transparent conductive material includes a metal.

In some embodiments, the first electrode 108a, the portion of the light-emitting layer 120 disposed in the second opening O2 and directly in contact with the underlying first electrode 108a, and the portion of the second electrode 130 overlapped with the light-emitting layer 120 along the thickness direction Z constitute a light-emitting element. In display device 10, a plurality of light-emitting elements is disposed in the pixel region A. As the number of the first electrodes 108a is not limited to what is depicted in FIG. 2, the number of the light-emitting elements in display device 10 also is not limited to what is depicted in FIG. 2, and may be designated based on the demand and/or design layout. In certain embodiments, the light-emitting element may be an OLED element. In detail, the light-emitting layer 120 of the light-emitting element is driven by the voltage difference generated between the first electrode 108a and the second electrode 130 to emit light. Since the driving signals can be transmitted to the first electrodes 108a through the active components (not shown) in the driving element layer 104, the light-emitting elements in display device 10 can be controlled by the active components (not shown) in the driving element layer 104. In some embodiments, the first electrode 108a serves as the anode of the light-emitting element, and the second electrode 130 serves as the cathode of the light-emitting element. However, the disclosure is not limited thereto. In some alternative embodiments, in terms of design requirements, the first electrode 108a serves as the cathode of the light-emitting element, and the second electrode 130 serves as the anode of the light-emitting element.

In some embodiments, the second electrode 130 is continuously disposed on the light-emitting layer 120 and the common electrode 108b, as shown in FIG. 1. Specifically, as the side surfaces of the isolation layer 110 (e.g., the first side surface S1 and the second side surface S2 of the first isolation pattern 112, the third side surfaces S3 and the fourth side surfaces S4 of the first pattern portions 114a, and the fifth side surfaces S5 and the sixth side surfaces S6 of the second pattern portions 114b) are covered by the light-emitting layer 120, the second electrode 130 is elevated by the underlying light-emitting layer 120 such that the second electrode 130 is away from the side surfaces of the isolation layer 110 which would render the layer discontinuous (e.g., the light-emitting layer 120). Further, when the minimum distance D between the outer edge of the portion of the light-emitting layer 120 disposed in the first opening O1 and the first side surface S1 of the first isolation pattern 112 is equal to or greater than half of the height H of the isolation layer 110, the second electrode 130 lifted up by the underlying light-emitting layer 120 can avoid being cut by the isolation layer 110. As such, the second electrode 130 is provided with good continuity, and thus the electrical yield of the display device 10 can be ensured.

In some embodiments, the dielectric encapsulation 140 encapsulates and covers the second electrode 130. In some embodiments, the dielectric encapsulation 140 fills into the first opening O1 to laterally encapsulate the second electrode 130. In some embodiments, the dielectric encapsulation 140 encapsulates the light-emitting elements in the display device 10 for isolating the light-emitting elements from moisture, impurities, and the like. In some embodiments, the material of the dielectric encapsulation 140 includes silicon oxide, silicon nitride, aluminum oxide, silicon carbonitride (SiCN), silicon oxynitride, acrylic resin, hexamethyl disiloxane (HMDSO), or glass, but the invention is not limited thereto.

Figure 3A:
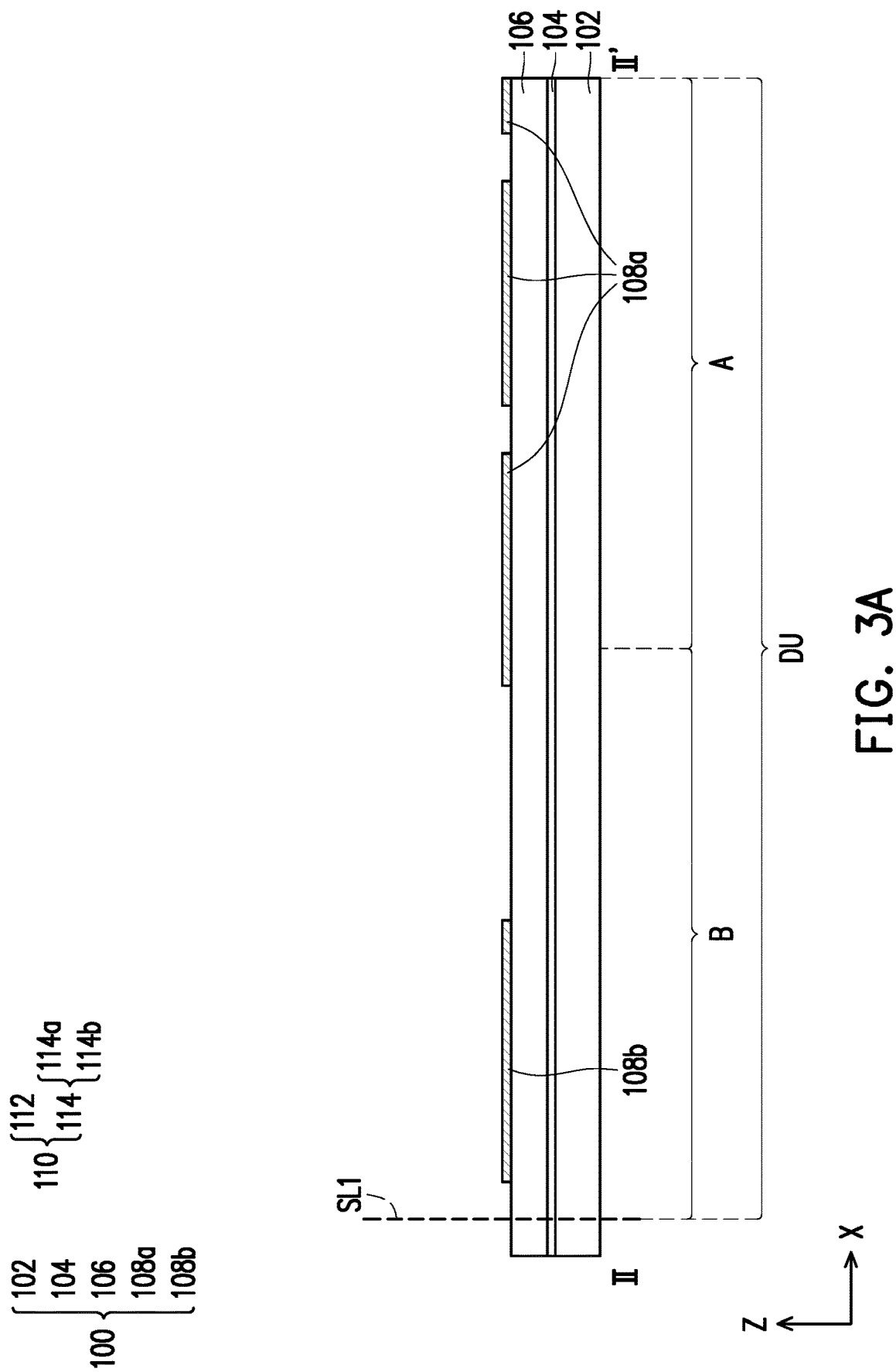
FIG. 3A to FIG. 3F are schematic cross-sectional views of various stages in a manufacturing method of a display device in accordance with some embodiments of the present disclosure.

The method of manufacturing the display device 10 will be described in detail below with reference to FIG. 3A to FIG. 3F and FIG. 4. FIG. 3A to FIG. 3F are schematic cross-sectional views of various stages in a manufacturing method of the display device 10 in accordance with some embodiments of the present disclosure. FIG. 4 is a simplified top view of an intermediate stage in a manufacturing method of the display device 10 in accordance with some embodiments of the present disclosure. Specifically, FIG. 3A is a cross-sectional view taken along the line II-II' of FIG. 4.

Referring to FIG. 3A and FIG. 4, a semiconductor substrate 100 is provided. In some embodiments, the semiconductor substrate 100 may be a semiconductor wafer. As such, the manufacturing method of the display device 10 illustrated in FIG. 3A to FIG. 3F may be considered as a wafer level process. In some embodiments, as shown in FIG. 4, the semiconductor substrate 100 has a plurality of device units DU arranged in an array. Each device unit DU corresponds to a portion of the semiconductor wafer W. As shown in FIG. 4, the device units DU are defined by a plurality of scribe lines SL1 and a plurality of scribe lines SL2. In some embodiments, as shown in FIG. 4, the scribe lines SL1 are arranged along the direction X perpendicular to the thickness direction Z of the semiconductor substrate 100, and the scribe lines SL2 are arranged along the direction Y perpendicular to the thickness direction Z, wherein the direction X is perpendicular to the direction Y. In some embodiments, each scribe line SL1 extends along the direction Y, and each scribe line SL2 extends along the direction X, as shown in FIG. 4. In addition, as shown in FIG. 4, the scribe lines SL1 cross over the scribe lines SL2 to render a plurality of columns and a plurality of rows. The number of the device units DU, the number of the scribe lines SL1 and the number of the scribe lines SL2 may be less than or more than what is depicted in FIG. 4, and may be designated based on the demand and/or design layout; the disclosure is not specifically limited thereto.

In some embodiments, as shown in FIG. 4, inside each of the device units DU is a pixel region A and a peripheral region B. At the stage of FIG. 3A, the semiconductor substrate 100 may have a plurality of pixel regions A arranged in an array. Details of the pixel region A and the peripheral region B have been described above, and will not be reiterated herein. In some embodiments, as shown in FIG. 3A, each of the device units DU may include a substrate 102, a driving element layer 104, an interconnect structure 106, first electrodes 108a and a common electrode 108b. In some embodiments, at the stage of FIG. 3A, the substrates 102 of the device units DU are connected with one another. Similarly, in some embodiments, at the stage of FIG. 3A, the driving element layers 104 of the device units DU are connected with one another, and the interconnect structures 106 of the device units DU are connected with one another. Details of the substrate 102, the driving element layer 104, the interconnect structure 106, the first electrode 108a and the common electrode 108b have been described above, and will not be reiterated herein.

Figure 3B:
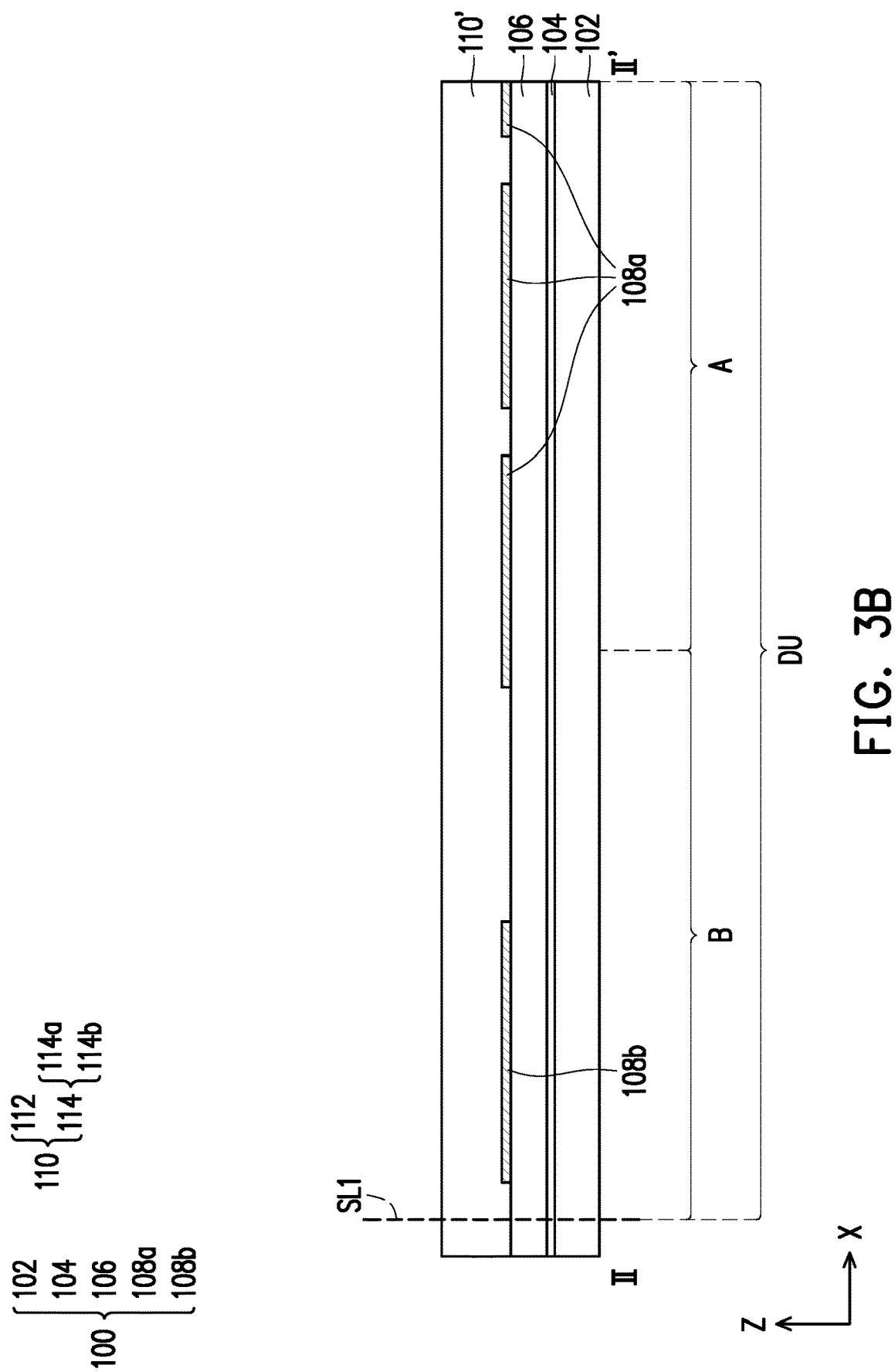
Figure 4:
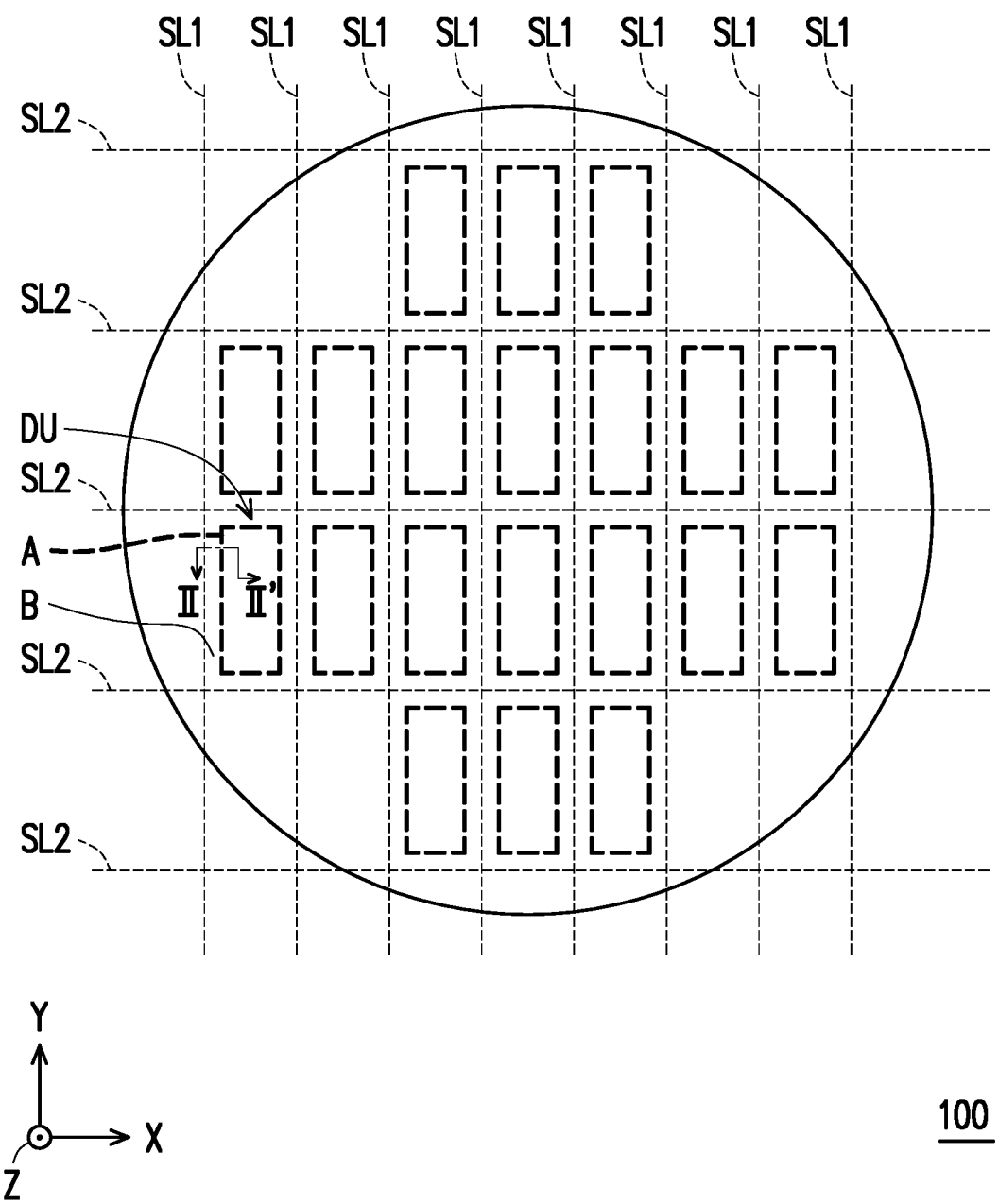
FIG. 4 is a simplified top view of an intermediate stage in a manufacturing method of a display device in accordance with some embodiments of the present disclosure.

Referring to FIG. 3B, an isolation layer 110' is formed on the semiconductor substrate 100 to cover the first electrodes 108a and the common electrode 108b. In some embodiments, the material of the isolation layer 110' includes silicon oxide, silicon oxynitride, silicon nitride, or a combination thereof. In certain embodiments, the isolation layer 110' is an oxide-nitride-oxide (ONO) layer. In some embodiments, the isolation layer 110' is formed by chemical vapor deposition (CVD), or any other suitable film deposition method.

Figure 3C:
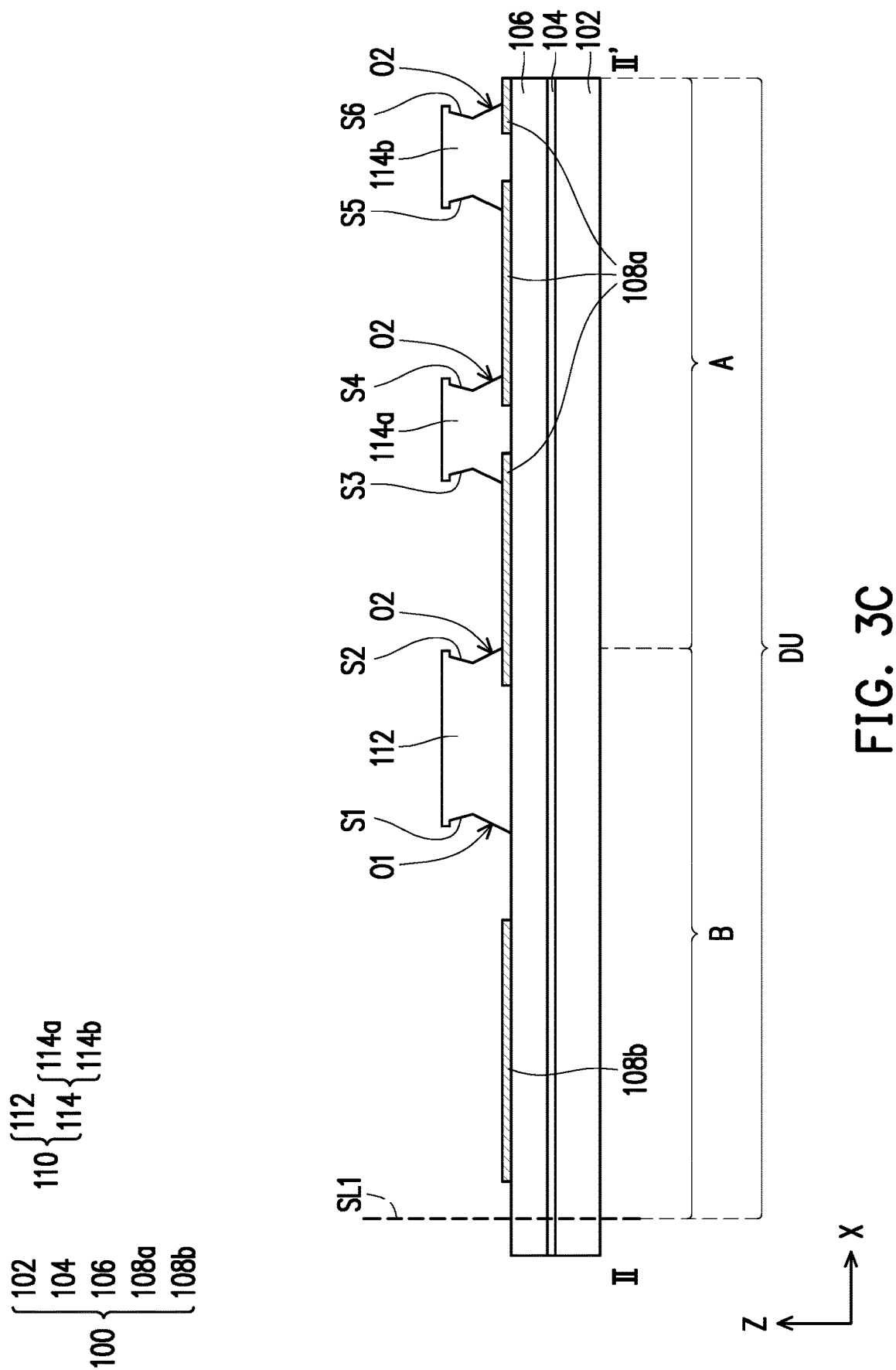

Referring to FIG. 3C, the isolation layer 110' is patterned to form an isolation layer 110. In some embodiments, the isolation layer 110 is formed by performing photolithography and etching processes. In some embodiments, the isolation layer 110 is formed by at least the following steps. First, a photoresist layer (not shown) is formed over the isolation layer 110'. In some embodiments, the photoresist layer may be formed through spin-coating or other suitable methods. Thereafter, the photoresist layer is patterned to form a patterned photoresist layer, and the isolation layer 110' is etched using the patterned photoresist layer as a mask so as to form the isolation layer 110. The patterned photoresist layer is then removed or stripped. In some embodiments, the isolation layer 110' is etched by a dry etching process, a wet etching process, or combination thereof. In some embodiments, the patterned photoresist layer may be removed or stripped through, for example, etching, ashing, or other suitable removal processes.

In some embodiments, as shown FIG. 3C, the isolation layer 110 includes a first isolation pattern 112 and a second isolation pattern 114, and the second isolation pattern 114 has first pattern portions 114*a* and second pattern portions 114*b*. In FIG. 3C, one first pattern portion 114*a* and one second pattern portion 114*b* are shown for simplicity. Based on the description of FIG. 1 and FIG. 2 mentioned above, those skilled in the art can understand that multiple first pattern portions 114*a* and multiple second pattern portions 114*b* may be formed to render a mesh structure.

In some embodiments, as shown FIG. 3C, the cross-sectional profile of the first side surface S1 of the first isolation pattern 112 and the cross-sectional profile of the second side surface S2 of the first isolation pattern 112 are substantially symmetric with each other. The cross-sectional profile of the third side surface S3 of the first pattern portion 114*a* and the cross-sectional profile of the fourth side surface S4 of the first pattern portion 114*a* are substantially symmetric with each other. The cross-sectional profile of the fifth side surface S5 of the second pattern portion 114*b* and the cross-sectional profile of the sixth side surface S6 of the second pattern portion 114*b* are substantially symmetric with each other. The cross-sectional profile of the first side surface S1, the cross-sectional profile of the third side surface S3 and the cross-sectional profile of the fifth side surface S5 are substantially the same with one another. The cross-sectional profile of the second side surface S2, the cross-sectional profile of the fourth side surface S4 and the cross-sectional profile of the sixth side surface S6 are substantially the same with one another. Configured as such, the cross-sectional profile of the first side surface S1, the cross-sectional profile of the second side surface S2, the cross-sectional profile of the third side surface S3, the cross-sectional profile of the fourth side surface S4, the cross-sectional profile of the fifth side surface S5 and the cross-sectional profile of the sixth side surface S6 may be regarded as substantially the same with one another. In view of this, the isolation layer 110 can be formed by performing the photolithography process with a single mask. As such, the forming process for the isolation layer 110 is simple and cost thereof is low.

Further, in some embodiments, as shown in FIG. 3C, after the pattering step is performed on the isolation layer 110', a first opening O1 and second openings O2 are formed in the isolation layer 110. In detail, as shown in FIG. 3C, the common electrode 108*b* is exposed by the first opening O1, and portions of the first electrodes 108*a* are exposed by the second openings O2. The other details of the isolation layer 110 have been described above, and will not be reiterated herein.

Figure 3D:
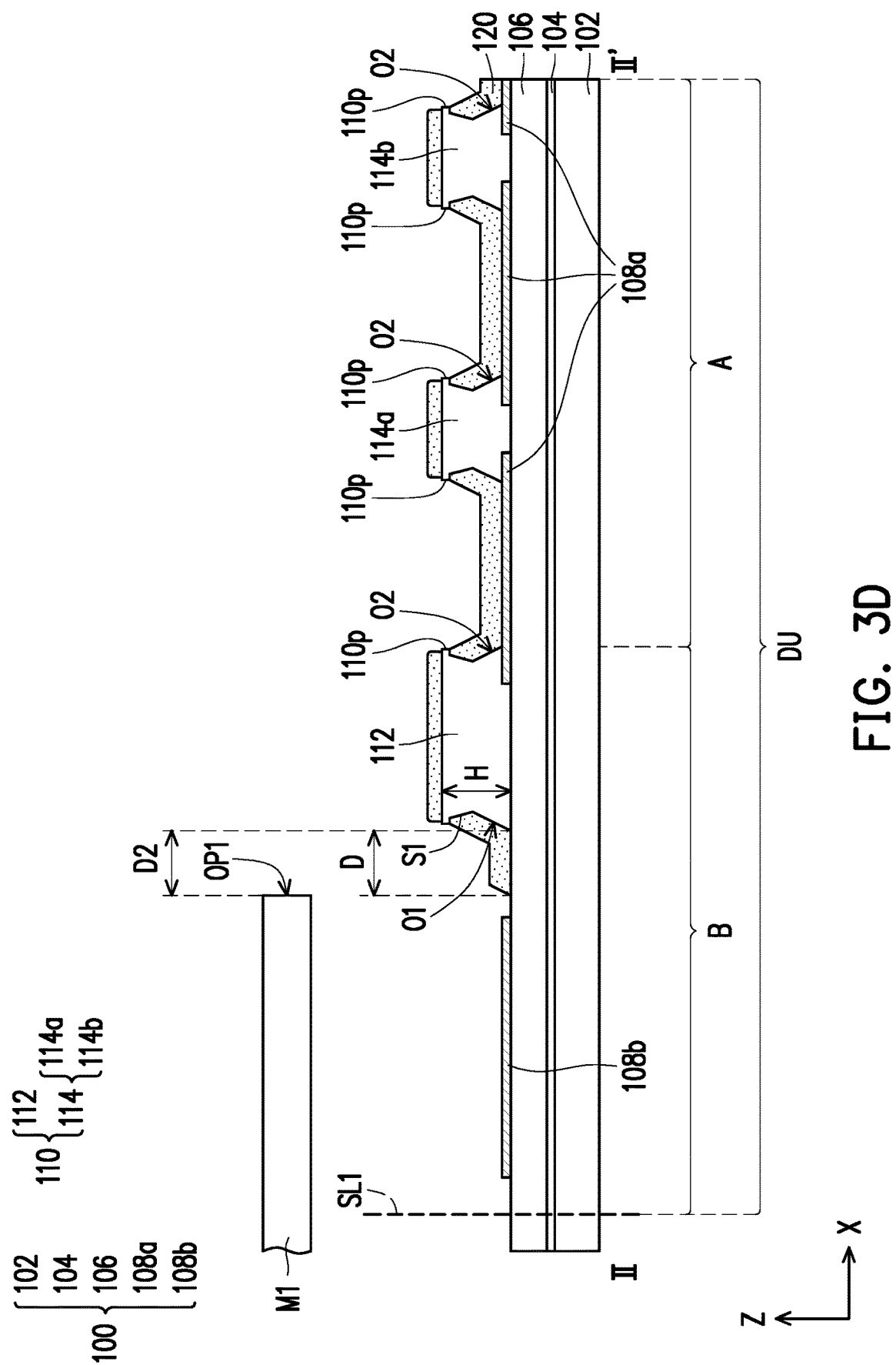

Referring to FIG. 3D, the light-emitting layer 120 is formed on the isolation layer 110 and in the first opening O1 and the second openings O2. The light-emitting layer 120 is disposed both in the pixel region A and the peripheral region B. In some embodiments, the light-emitting layer 120 is formed by evaporation or any other suitable film deposition method. As shown in FIG. 3D, a first mask M1 with a first opening pattern OP1 is utilized for forming the light-emitting layer 120. In FIG. 3D, one first opening pattern OP1 is shown for simplicity. Based on the description of FIG. 3A and FIG. 4 mentioned above, those skilled in the art can understand that multiple first opening patterns OP1 corresponding to the device units DU are formed in the first mask M1.

In some embodiments, the first opening pattern OP1 is provided to define a location of the light-emitting layer 120. In some embodiments, the first opening pattern OP1 exposes the isolation layer 110 in the thickness direction Z of the semiconductor substrate 100. As shown in FIG. 3D, the light-emitting layer 120 is discontinuously formed on the isolation layer 110 due to the cross-sectional profile of the side surfaces of the isolation layer 110. That is to say, even though the whole isolation layer 110 is exposed by the first opening pattern OP1, portions 110*p* of the isolation layer 110 are not covered by the light-emitting layer 120. In some embodiments, the minimum distance D2 between the boundary of the first opening pattern OP1 and the first side surface S1 of the first isolation pattern 112 is equal to or greater than half of the height H of the isolation layer 110. With such location relationship between the first mask M1 and the isolation layer 110, the minimum distance D between the outer edge of the portion of the light-emitting layer 120 disposed in the first opening O1 and the first side surface S1 of the first isolation pattern 112 is equal to or larger than half of the height H of the isolation layer 110. The other details of the light-emitting layer 120 have been described above, and will not be reiterated herein.

Figure 3E:
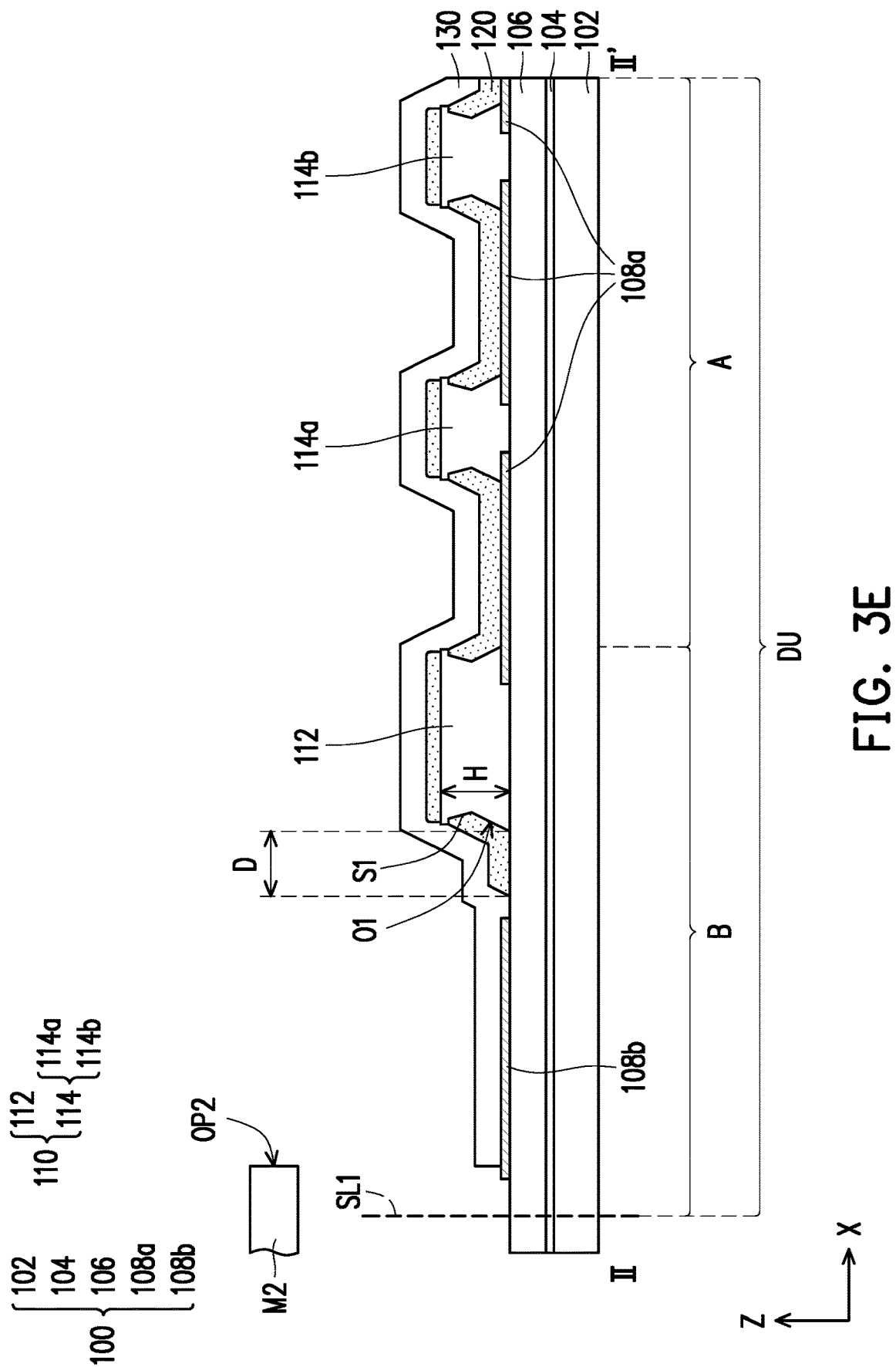

Referring to FIG. 3E, a second electrode 130 is formed on the light-emitting layer 120. In some embodiments, the second electrode 130 is formed by evaporation, chemical vapor deposition (CVD), physical vapor deposition (PVD), or any other suitable film deposition method. In detail, as shown in FIG. 3E, a second mask M2 with a second opening pattern OP2 is utilized to form the second electrode 130. In FIG. 3E, one second opening pattern OP2 is shown for simplicity. As illustrated in FIG. 3A and FIG. 4 and described above, multiple second opening patterns OP2 corresponding to the device units DU may be formed in the second mask M2.

In some embodiments, the second opening pattern OP2 is provided to define a location of the second electrode 130. In some embodiments, the second opening pattern OP2 exposes the light-emitting layer 120 in the thickness direction Z of the semiconductor substrate 100. As shown in FIG. 3E, the second electrode 130 is formed to continuously extend from the pixel region A to the peripheral region B over the semiconductor substrate 100. Specifically, the second electrode 130 is elevated by the underlying light-emitting layer 120, such that the second electrode 130 is away from the side surfaces of the isolation layer 110 which cause discontinuity in the layer (e.g., the light-emitting layer 120). Further, in certain embodiments, the minimum distance D by which the light-emitting layer 120 extends onto the illustrated top surface of the semiconductor substrate 100 in peripheral region B is equal to or larger than half of the height H of the isolation layer 110, such that the second electrode 130 elevated by the underlying light-emitting layer 120 can avoid being cut by the isolation layer 110. As such, the second electrode 130 is formed with good continuity, and thus the electrical yield of the display device 10 can be ensured. By arranging the minimum distance D to be equal to or larger than half of the height H of the isolation layer 110, even though the isolation layer 110 is formed with a single mask to have all side surfaces with consistent cross-sectional profile which would normally break up the layer formed thereon, the second electrode 130 can be continuously formed over the semiconductor substrate 100 to ensure the electrical yield of the display device 10. Accordingly, complexity and cost for manufacturing the display device 10 are reduced, and yield and performance of the display device 10 are improved.

In some embodiments, the second opening pattern OP2 exposes the common electrode 108b in the thickness direction Z of the semiconductor substrate 100. The second electrode 130 formed by utilizing the second mask M2 is directly in contact with the underlying common electrode 108b to render electrical connection with the semiconductor substrate 100. The other details of the second electrode 130 have been described above, and will not be reiterated herein.

Figure 3F:
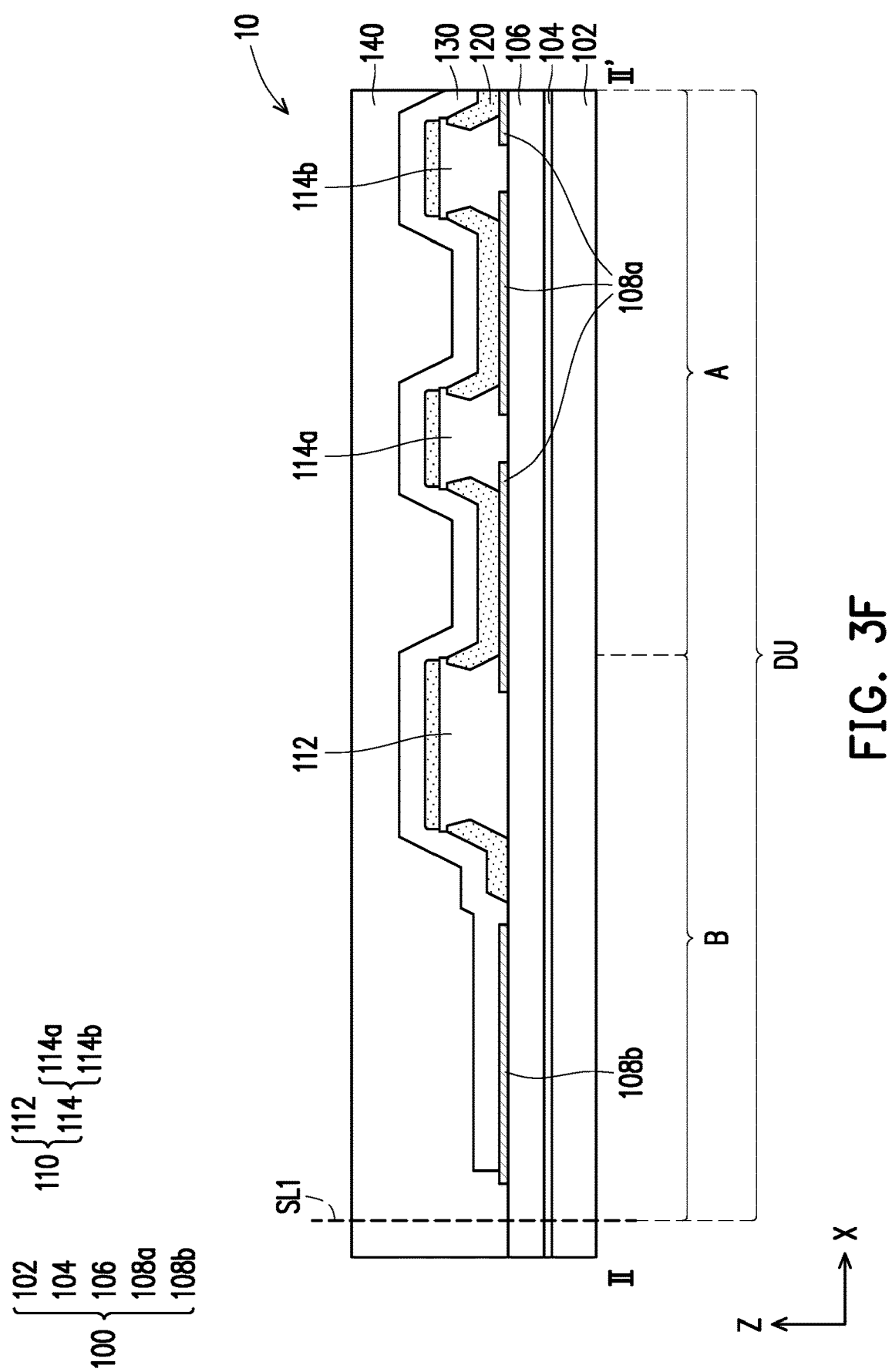

Referring to FIG. 3F, a dielectric encapsulation 140 is formed over the second electrode 130. In some embodiments, as shown in FIG. 3F, the dielectric encapsulation 140 is entirely formed over the semiconductor substrate 100. In some embodiments, the dielectric encapsulation 140 is formed by chemical vapor deposition (CVD), evaporation, or any other suitable fabrication technique. The other details of the dielectric encapsulation 140 have been described above, and will not be reiterated herein.

After the dielectric encapsulation 140 is formed, a singulation process is performed to cut the semiconductor substrate 100 and the dielectric encapsulation 140 to render a plurality of display devices 10. The singulation process is performed to separate the individual display devices 10, for example, by cutting along the scribe lines SL1 and the scribe lines SL2 arranged between the individual device units DU as shown in FIG. 4. The singulation process may be a laser cutting process, a mechanical cutting process, or other suitable process. In some embodiments, the singulation process is dicing by a rotating blade or a laser beam. In some embodiments, the display device 10 is suitable for the near-eye display applications.

Although processes are illustrated and described as a series of acts or events, it will be appreciated that the illustrated ordering of such acts or events are not to be interpreted in a limiting sense. In addition, not all illustrated processes are required to implement one or more embodiments of the present disclosure.

In the manufacturing method of the display device 10 illustrated in FIG. 3A to FIG. 3F, the light-emitting layer 120 is formed to cover the semiconductor substrate 100 in the peripheral region B by the range of the minimum distance D, while the first isolation pattern 112 of the isolation layer 110 is formed without being directly in contact with the common electrode 108b. The formation of the isolation layer 110 may be accomplished by using a mask pull-back process. In some embodiments, the mask pull-back process includes widening the opening pattern in the mask used for defining the first opening O1 of the isolation layer 110. However, the disclosure is not limited thereto. Hereinafter, other embodiments will be described with reference to FIG. 5.

Figure 5:
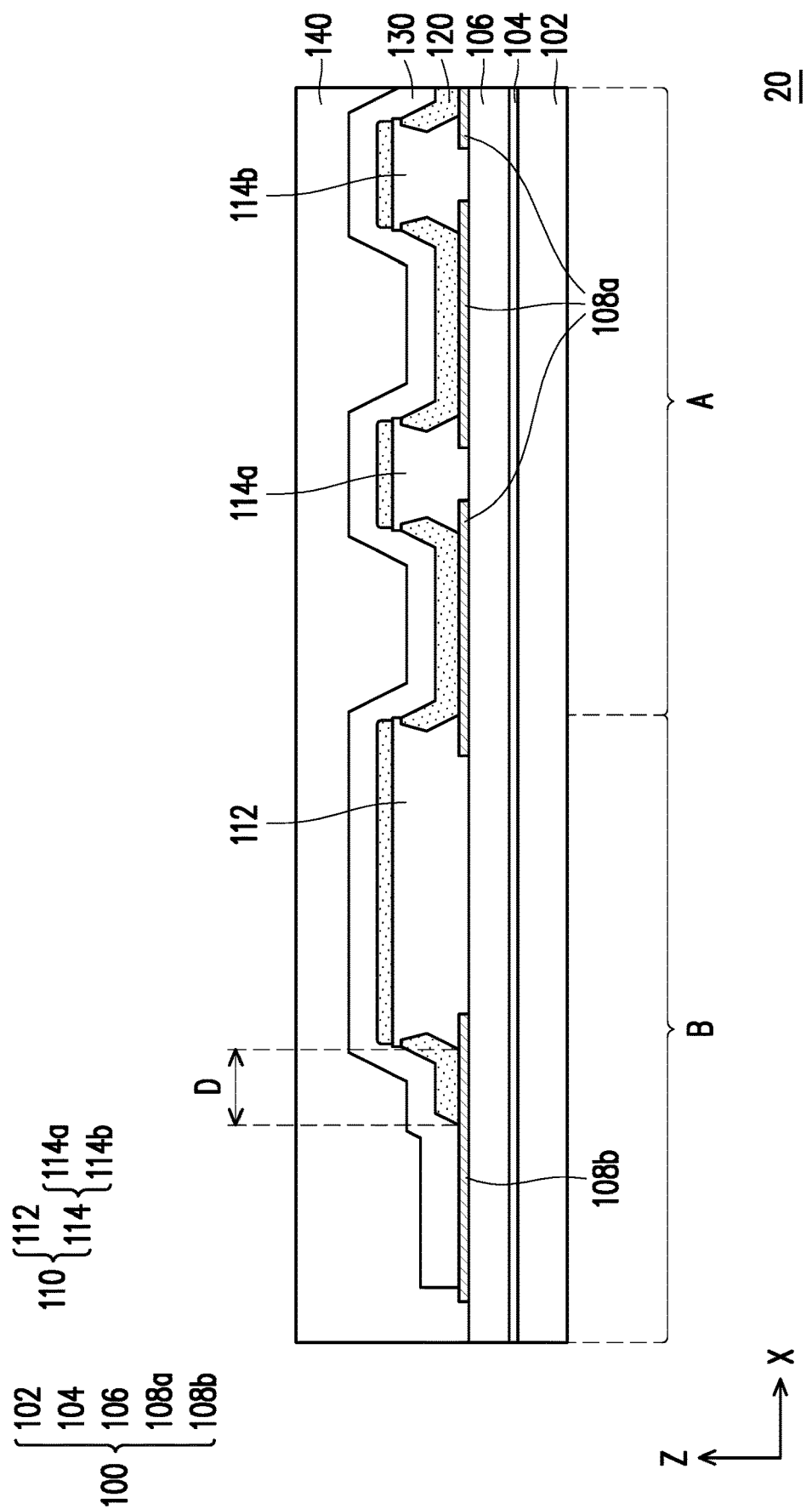
FIG. 5 is a schematic cross-sectional view of a display device in accordance with some alternative embodiments of the present disclosure.

FIG. 5 is a schematic cross-sectional view of a display device in accordance with some alternative embodiments of the present disclosure. Referring to FIG. 5 and FIG. 1, the display device 20 of FIG. 5 is similar to the display device 10 of FIG. 1 illustrated as the cross-section taken along line I-I' of FIG. 2. Hence the same reference numerals are used to refer to the same or like parts, and detailed description thereof is not repeated herein. The differences between the display device 20 and the display device 10 are described below.

Referring to FIG. 5, in the display device 20, the light-emitting layer 120 covers the semiconductor substrate 100 in the peripheral region B by the range of the minimum distance D, while the first isolation pattern 112 of the isolation layer 110 is formed directly in contact with the common electrode 108b. In such case, the formation of the light-emitting layer 120 may be accomplished by using a mask pull-back process. In the mask pull-back process for forming the light-emitting layer 120, the first opening pattern OP1 of the first mask M1 (as shown in FIG. 3D) for defining the location of the light-emitting layer 120 may be widened to expose both the isolation layer 110 and the common electrode 108b.

In accordance with some embodiments, a display device includes a semiconductor substrate, an isolation layer, a light-emitting layer and a second electrode. The semiconductor substrate has a pixel region and a peripheral region located around the pixel region, wherein the semiconductor substrate includes first electrodes and a driving element layer. The first electrodes are disposed in the pixel region and the first electrodes are electrically connected to the driving element layer. The isolation layer is disposed on the semiconductor substrate, wherein the isolation layer includes a first isolation pattern disposed in the peripheral region, the first isolation pattern has a first side surface and a second side surface opposite to the first side surface. The light-emitting layer is disposed on the isolation layer and the first electrodes, and covers the first side surface and the second side surface of the first isolation pattern. The second electrode is disposed on the light-emitting layer.

In accordance with some embodiments, a display device includes a semiconductor substrate, an isolation layer, a light-emitting layer and a second electrode. The semiconductor substrate has a pixel region and a peripheral region located around the pixel region, wherein the semiconductor substrate includes first electrodes and a driving element layer. The first electrodes are disposed in the pixel region and the first electrodes are electrically connected to the driving element layer. The isolation layer is disposed on the semiconductor substrate, wherein the isolation layer includes a first opening in the peripheral region and second openings in the pixel region. The light-emitting layer is disposed on the isolation layer and in the first opening and the second openings. The second electrode is disposed on the light-emitting layer.

In accordance with some embodiments, a manufacturing method of a display device includes at least the following steps. A semiconductor substrate having device units is provided, wherein each of the device units has a pixel region and a peripheral region located around the pixel region, and the semiconductor substrate includes first electrodes and a driving element layer. The first electrodes are disposed in the pixel region and the first electrodes are electrically connected to the driving element layer. An isolation layer is formed on the semiconductor substrate. The isolation layer is patterned to form a first opening in the peripheral region and second openings in the pixel region, wherein the second openings expose the first electrodes. A light-emitting layer is formed on the patterned isolation layer and in the first opening and the second openings. A second electrode is formed on the light-emitting layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A display device, comprising:
a semiconductor substrate having a pixel region and a peripheral region located around the pixel region, wherein the semiconductor substrate includes first electrodes disposed in the pixel region;
a first isolation pattern disposed in the peripheral region of the semiconductor substrate, wherein the first isolation pattern has a first side surface facing away from the pixel region;
a light-emitting layer disposed on the first isolation pattern and the first electrodes, and covering the first side surface of the first isolation pattern; and
a second electrode disposed on the light-emitting layer.

2. The display device of claim 1, wherein the first isolation pattern has a second side surface facing toward the pixel region, and a minimum distance between an outer edge of the light-emitting layer and the first side surface is equal to or larger than half of a height of the first isolation pattern.

3. The display device of claim 2, further comprising a second isolation pattern disposed in the pixel region of the semiconductor substrate, the second isolation pattern has first pattern portions and second pattern portions, the first pattern portions are arranged along a first direction, the second pattern portions are arranged along a second direction, and the first direction is perpendicular to the second direction, and each of the first pattern portions has a third side surface and a fourth side surface opposite to the third side surface.

4. The display device of claim 3, wherein a cross-sectional profile of the first side surface, a cross-sectional profile of the second side surface, a cross-sectional profile of the third side surface and a cross-sectional profile of the fourth side surface are substantially the same.

5. The display device of claim 1, wherein the semiconductor substrate further includes a common electrode disposed in the peripheral region and electrically connected to the second electrode.

6. The display device of claim 1, wherein the light-emitting layer is discontinuously disposed on the first isolation pattern and the first electrodes, and the second electrode is continuously disposed on the light-emitting layer.

7. The display device of claim 1, wherein the first isolation pattern has a ring shape.

8. The display device of claim 1, further comprising a dielectric encapsulation encapsulating and covering the second electrode.

9. A display device, comprising:
a semiconductor substrate including a pixel region and a peripheral region located around the pixel region, wherein the semiconductor substrate includes first electrodes disposed in the pixel region and a common electrode disposed in the peripheral region;
an isolation layer disposed on the semiconductor substrate and including a first opening and second openings, wherein along a thickness direction of the semiconductor substrate, a vertical projection of the common electrode falls within a span of a vertical projection of the first opening, and a vertical projection of the first electrodes is partially overlapped with a span of a vertical projection of the second openings;
a light-emitting layer disposed on the isolation layer and in the first opening and the second openings; and
a second electrode disposed on the light-emitting layer.

10. The display device of claim 9, wherein the light-emitting layer covers a sidewall of the first opening defined by the isolation layer and sidewalls of the second openings defined by the isolation layer.

11. The display device of claim 9, wherein the light-emitting layer disposed in the second openings contacts the first electrodes.

12. The display device of claim 10, wherein a minimum distance between an outer edge of the light-emitting layer disposed in the first opening and the sidewall of the first opening defined by the isolation layer is equal to or larger than half of a height of the isolation layer.

13. The display device of claim 10, wherein a cross-sectional profile of the sidewall of the first opening defined by the isolation layer is substantially the same as a cross-sectional profile of each of the sidewalls of the second openings defined by the isolation layer.

14. The display device of claim 9, further comprising a dielectric encapsulation encapsulating the second electrode and filling in the first opening.

15. A manufacturing method of a display device, comprising:
providing a semiconductor substrate having device units, wherein each of the device units has a pixel region and a peripheral region located around the pixel region, the semiconductor substrate includes first electrodes disposed in the pixel region;
forming a first isolation pattern over the semiconductor substrate, wherein the first isolation pattern is disposed in the peripheral region, and the first isolation pattern has a first side surface and a second side surface opposite to the first side surface;
forming a light-emitting layer on the first isolation pattern and the first electrodes, and covering the first side surface and the second side surface of the first isolation pattern; and
forming a second electrode on the light-emitting layer.

16. The manufacturing method of claim 15, wherein during the formation of the first isolation pattern, a second isolation pattern disposed in the pixel region is formed, and the first isolation pattern and the second isolation pattern are formed by performing a photolithography process with a single mask.

17. The manufacturing method of claim 15, wherein forming the light-emitting layer includes:
providing a first mask with a first opening pattern; and
performing a first deposition process to form the light-emitting layer on the first isolation pattern and the first electrodes corresponding to the first opening pattern of the first mask, wherein the first opening pattern exposes the first isolation pattern and the first electrodes in a thickness direction of the semiconductor substrate.

18. The manufacturing method of claim 17, wherein during the first deposition process, a minimum distance between a boundary of the first opening pattern of the first mask and the first side surface of the first isolation pattern is equal to or larger than half of a height of the first isolation pattern.

19. The manufacturing method of claim 17, wherein forming the second electrode includes:
providing a second mask with a second opening pattern; and
performing a second deposition process to form the second electrode on the light-emitting layer corresponding to the second opening pattern of the second mask, wherein the second opening pattern exposes the light-emitting layer in the thickness direction of the semiconductor substrate.

20. The manufacturing method of claim 15, further comprising:
    forming a dielectric encapsulation over the second electrode; and
    performing a singulation process to cut the semiconductor substrate and the dielectric encapsulation.

* * * * *